United States Patent
Furuichi et al.

(10) Patent No.: US 7,508,255 B2
(45) Date of Patent: Mar. 24, 2009

(54) POWER SUPPLY CONTROLLER

(75) Inventors: Masahiko Furuichi, Yokkaichi (JP); Masayuki Kato, Yokkaichi (JP); Seiji Takahashi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 133 days.

(21) Appl. No.: 11/657,038

(22) Filed: Jan. 24, 2007

(65) Prior Publication Data
US 2007/0170978 A1 Jul. 26, 2007

(30) Foreign Application Priority Data
Jan. 25, 2006 (JP) ............... 2006-016771

(51) Int. Cl.
*H02H 3/14* (2006.01)
(52) U.S. Cl. ...................... 327/543; 327/541
(58) Field of Classification Search ......... None
See application file for complete search history.

(56) References Cited

U.S. PATENT DOCUMENTS

| 6,377,428 | B1* | 4/2002 | Ogasawara ......... 361/86 |
| 7,283,343 | B2* | 10/2007 | Grose et al. ......... 361/84 |
| 2007/0127180 | A1* | 6/2007 | Lin et al. ......... 361/93.7 |

FOREIGN PATENT DOCUMENTS

JP   A-2001-217696   8/2001

\* cited by examiner

*Primary Examiner*—Donovan Lincoln
*Assistant Examiner*—Terry L Englund
(74) *Attorney, Agent, or Firm*—Oliff & Berridge, PLC

(57) ABSTRACT

A power supply controller including a MOSFET between a power source and a load, a ground terminal, a gate driving circuit structured to control a gate potential of the MOSFET to turn on power and control the gate potential of the MOSFET to turn off power based on a ground terminal potential, and a turn-off circuit structured to switch the MOSFET into a turn-off state regardless of control by the gate driving circuit when the ground terminal potential is at a higher value than a source potential of the MOSFET.

18 Claims, 3 Drawing Sheets

POWER SUPPLY CONTROLLER

CROSS REFERENCE TO RELATED APPLICATION

This application claims priority from Japanese Patent Application No. 2006-016771 filed Jan. 25, 2006. The entire content of this priority application is incorporated herein by reference.

TECHNICAL FIELD

The present disclosure relates to a power supply controller.

BACKGROUND

A power supply controller can be used as a so-called high side driver, which has an n-channel MOSFET inserted between a positive power source and a load to perform current control, as described in Japanese Patent Laid-Open No. 2001-217696, for example. When a power supply controller is used as a high side driver in such a manner, the gate voltage of the MOSFET must be driven to a level higher than a power supply voltage (typically to a voltage approximately twice the power supply voltage) for the MOSFET to reliably turn on. For this purpose, a gate driving circuit (for example a charge pump circuit) is required. In particular, a gate driving circuit receives a predetermined input voltage. When an ON signal for turning on the MOSFET is input from an external source to the power supply controller, the gate driving circuit rises the input voltage and outputs the risen voltage to the gate of the MOSFET to turn on the MOSFET.

The gate driving circuit controls the gate electric potential of the MOSFET on the basis of the electric potential at a ground terminal provided in the power supply controller to turn off the MOSFET. Accordingly, when the ground terminal is not grounded and the source of the MOSFET is properly grounded through a load, the electric potential at the ground terminal approaches the electric potential of the positive power source and, along with this increase, the gate electric potential of the MOSFET also increases and approaches the electric potential of the positive power source. As a result, regardless of input of the ON signal the potential difference between the source and gate (the gate-source voltage) of the MOSFET exceeds a threshold voltage of the MOSFET and can erroneously cause the MOSFET to turn on.

SUMMARY

A power supply controller according to the present invention includes: an n-channel MOSFET provided between a power source and a load; a ground terminal; a gate driving circuit structured to control a gate terminal potential of the MOSFET to turn on power and control the gate terminal potential of the MOSFET to turn off power based on a ground terminal potential; and a turn-off circuit structured to switch the MOSFET into a turn-off state regardless of control by the gate driving circuit when the ground terminal potential is at a higher value than a source potential of the MOSFET.

According to the present invention, when a ground terminal is not properly grounded for example and the therefore electric potential of the ground terminal is higher than the source potential of the MOSFET by an amount equal to a predetermined level, the MOSFET is forced to turn off. Thus, a malfunction can be prevented such as causing the MOSFET to turn on power when an ON signal for causing the MOSFET to turn on power is not input.

BRIEF DESCRIPTION OF THE DRAWINGS

Illustrative aspects in accordance with the invention will be described in detail with reference to the following figures wherein.

DETAILED DESCRIPTION OF THE PREFERRED ILLUSTRATIVE ASPECTS

An illustrative aspect of the present invention will be described with reference to FIGS. 1 and 2.

Figure 1:
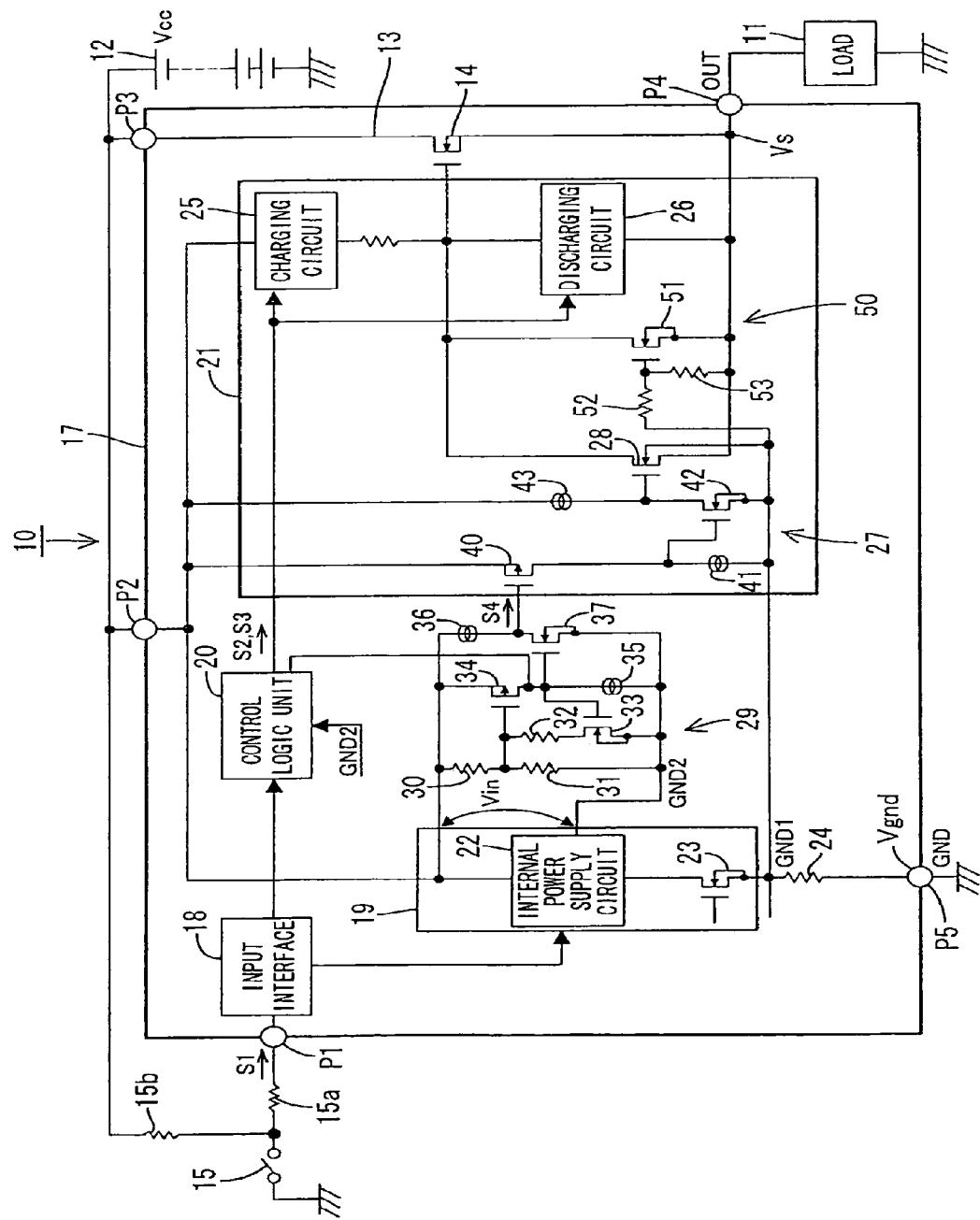
FIG. 1 is a block diagram showing an overview of a power supply controller according to an illustrative aspect of the present invention.

FIG. 1 is a block diagram showing an overall configuration of a power supply controller 10 according to the illustrative aspect. The power supply controller 10 is provided in a vehicle, not shown, and controls power supply from an on-vehicle power source (hereinafter referred to as the "power source 12") to a load 11. The load 11 may be a vehicle lamp, a cooling fan motor, a wiper motor, a defogger heater, or the like. The power supply controller 10 is used as a so-called high side driver, which has an n-channel MOSFET (hereinafter referred to as the "power MOSFET 14") provided between a positive power source 12 and a load 11 for controlling current.

(1) Basic Configuration

The power supply controller 10 includes the power MOSFET 14 provided on a power supply line 13 for supplying power from the power source 12 to the load 11. The power supply controller 10 receives a control signal S1 such as constant voltage signal or a PWM (Pulse Width Modulation) control signal from an external source and causes the MOSFET 14 to turn on and off in accordance with the control signal S1, thereby controlling power supply to the load 11 connected to the power MOSFET 14. In this illustrative aspect, the power supply controller 10 has an input terminal P1, which is connected to an external operation switch 15. When the switch 15 is turned on, the power supply controller 10 is activated. In particular, the input terminal P1 is connected to the operation switch 15 through a resistance 15a, and the connection point between the resistance 15a and the operation switch 15 is connected to the power source 12 through a resistance 15b. The input terminal P1 is pulled up to a power supply potential Vcc when the operation switch 15 is in the off state.

As shown in FIG. 1, the power supply controller 10 is implemented as a semiconductor device 17 that includes the input terminal P1, a power supply terminal P2 and a tab terminal P3 connected to the power source 12, a load connection terminal P4 connected to the load 11, and a ground terminal P5 connected to the vehicle's sheet metal, for example, and maintained at a ground potential.

The semiconductor device 17 includes an input interface 18, an internal ground potential generator 19, a control logic unit 20, and a gate driving circuit 21. The input of the input interface 18 is connected to the input terminal P1. When the operation switch 15 is in the off state, a high-level control signal S1 is input in the input interface 18; when the operation switch 15 is in the on state, a low-level control signal S1 is input in the input interface 18. The control signal S1 is provided to the internal ground potential generator 19 and the control logic unit 20.

The internal ground potential generator 19 includes an internal power supply circuit 22. The input of the internal power supply circuit 22 is connected to the power supply terminal P2 and the output of the internal power supply circuit 22 is connected to the ground terminal P5 through a FET 23, which is a switching element, and a resistance 24. In response to the low-level control signal S1 from the input interface 18, the FET 23 of the internal ground potential generator 19 turns on to bring the internal power supply circuit 22 into conduction, thereby generating an internal ground potential GND2 that is lower than the power supply potential Vcc by a predetermined constant voltage Vx (for example 6V in the illustrative aspect). A generated voltage Vin that is equal to the power supply potential Vcc minus the internal ground voltage GND2 is supplied to the control logic unit 20 to place the control logic unit 20 in the operational state. When the potential difference (hereinafter referred to as the "power supply voltage Vcc'") between the power supply potential Vcc and the potential Vgnd of the ground terminal P5 is lower than the constant voltage Vx because for example the power supply potential Vcc decreases due to a low charge of the power source 12 or the ground terminal P5 is not properly grounded, the voltage Vin generated by the internal power supply circuit 22 is approximately equal to the power supply voltage Vcc'. Therefore, when the power supply voltage Vcc' is low, a variation in the level of the power supply voltage Vcc' can be indirectly observed by observing a generated voltage Vin which indicates a value equivalent to the power supply voltage Vcc'.

The control logic unit 20 can operate when the voltage Vin generated by the internal power supply 22 is higher than or equal to a second level. The second level may be 3 V in the illustrative aspect. When the control logic unit 20 receives the low-level control signal S1 from the input interface 18, the control logic unit 20 controls the gate driving circuit 21 to cause the power MOSFET 14 to turn on power, on condition that the power supply voltage Vcc' (voltage Vin generated by the internal power supply circuit 22) at that time point is higher than a first level (>the second level).

A charging circuit 25 for driving the gate of the power MOSFET 14 as will be described later increases the power supply voltage Vcc' input in it to raise the gate potential to a value higher than the power supply potential Vcc, thereby causing the power MOSFET 14 to turn on power. Accordingly, when the power supply voltage Vcc' is lower than a certain level, the gate potential cannot be raised to a sufficient level for causing the power MOSFET 14 to turn on power. The control unit 20 is therefore designed to drive the charging circuit 25 if the power supply voltage Vcc' is higher than or equal to the first level (for example 4.5 V in the illustrative aspect) that is sufficiently high enough to cause the power MOSFET 14 to reliably turn on power as described above.

On the other hand, upon receiving a high-level control signal S1, the control logic unit 20 controls the gate driving circuit 21 to cause the power MOSFET 14 to turn off power. In the illustrative aspect, the low-level control signal S1 is an example of the "ON signal" for causing the power MOSFET 14 to turn on power and the high-level control signal S1 is an example of the "OFF signal" for causing the power MOSFET 14 to turn off.

The gate driving circuit 21 includes the charging circuit 25 connected between the power supply terminal P2 and the gate of the power MOSFET 14, and a discharging circuit 26 connected between the gate of the power MOSFET 14 and the load connection terminal P4. The charging circuit 25 is a charge pump circuit. When the control logic unit 20 receives the low-level control signal S1 (ON signal), the charging circuit 25 receives a drive signal S2 from the control logic 20 and drives the gate of the power MOSFET 14 to raise the gate potential to a level approximately twice as high as the power supply potential Vcc, thereby causing the power MOSFET 14 to reliably turn on, on condition that the power supply voltage Vcc' (generated voltage Vin) is higher than or equal to the first level. On the other hand, when the control logic unit 20 receives the high-level control signal S1 (OFF signal), the discharging circuit 26 receives a drive signal S3 from the control logic 20 to drive the gate of the power MOSFET 14 to discharge the gate charge accumulated on the power MOSFET 14 to cause power MOSFET 14 to turn off. The turn off (operation) of the power MOSFET 14 based on the high-level control signal (OFF signal) is referred to as the "normal turn off (operation)".

(2) Measure Against Power Supply Voltage Drop

The semiconductor device 17 includes a discharge preventing circuit 27 for holding the power MOSFET 14 in the power-on state if the power supply voltage Vcc' drops below the first level while the power MOSFET 14 is in the power-on state. The discharge preventing circuit 27 includes a FET 28 for preventing discharge, which is a switching element connected between the gate of the power MOSFET 14 and the load connection terminal P4, and a hysteresis circuit 29 into which the voltage Vin generated by the internal power supply circuit 22 is input.

When the voltage Vin generated by the internal power supply circuit 22 increases and exceeds the first level, the hysteresis circuit 29 provides a low-level output signal S4 for turning off the FET 28 (preventing discharge). When the generated voltage Vin subsequently decreases below the second level, the hysteresis circuit 29 provides a high-level output signal S4 for turning on the FET 28 (discharging).

In particular, resistances 30 and 31 are connected in series between the input and output of the internal power supply circuit 22. A resistance 32 and a FET 33 are connected in parallel to the resistance 31. A FET 34 and a constant current element 35 are connected in series between the input and output of the internal power supply circuit 22 so that a partial voltage obtained through use of the resistances 30 and 31 is provided to the gate of the FET 34. A constant current element 36 and a FET 37 are connected in series between the input and output of the internal power supply circuit 22. The gate of the FET 37 and the gate of the FET 33 are connected in common with the drain of the FET 34. The threshold voltage of the FET 34 is set to, for example, 1.5 V in the illustrative aspect. The resistance ratios among the resistances 30, 31, and 32 are set to 1:2:2, for example.

With this configuration, the FETs 33, 34, and 37 are in the off state until the voltage Vin generated by the internal power supply circuit 22 reaches the first level. When the voltage Vin reaches the first level, the gate-source voltage of the FET 34 reaches the threshold voltage (1.5 V) and, as a result, the FETs 33 and 37 are turned on and the output voltage signal S4 goes from high to low. The control logic unit 20 is connected to the drain of the FET 34 and can recognize that the voltage Vin generated by the internal power supply circuit 22 has increased to a level higher than or equal to the first level, on the basis of inversion of the electric potential of the drain from the low to the high level. Once the generated voltage Vin becomes higher than or equal to the first level, the FET 33 turns on and the threshold for inverting the output signal S4 from the low level to the high level becomes equal to a second level.

The gate driving circuit 21 includes a FET 40 and a constant current element 41 interconnected in series and a FET 42 and a constant current element 43 interconnected in series between the power supply terminal P2 and the connection point (GND1) between the FET 23 and the resistance 24. The FET 40 turns on upon receiving a low-level output signal S4 at its gate from the hysteresis circuit 29. As a result, the FET 42 whose gate is connected to the drain of the FET 40 turns on and the FET 28 turns off to shut off the path for discharging charge from the gate of the power MOSFET 14, thereby holding the power MOSFET 14 in the power-on state.

On the other hand, when the output signal S4 from the hysteresis circuit goes from low to high, the FET 28 turns on to discharge the charge from the gate of the power MOSFET 14, thereby causing the power MOSFET 14 to turn off power. The turn-off operation forces the power MOSFET 14 to turn off while the ON signal is being input and, is hence hereinafter referred to as the "first forced turn off (operation)". The constant current elements 35, 36, 41, and 43 may be resistive circuit elements such as resistances.

Figure 2:
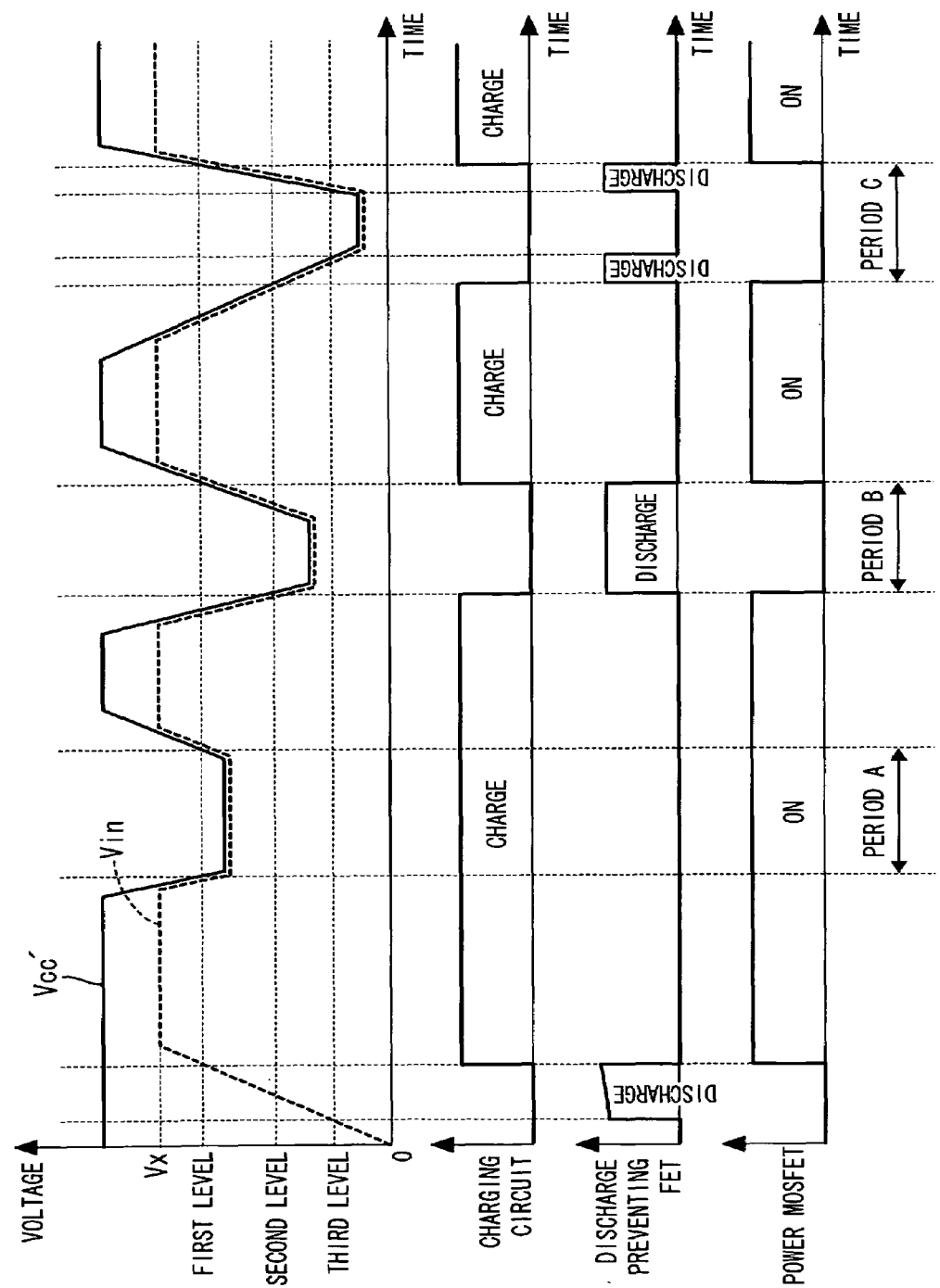
FIG. 2 is a timing chart showing an operation of a discharge preventing circuit responsive to variations in the level of a power supply voltage.

FIG. 2 is a timing chart showing an operation of the discharge preventing circuit 27 responsive to variations in the level of the power supply voltage Vcc'. A third level (<second level) in FIG. 2 is the level of the power supply voltage Vcc' required for turning on the FET 28.

When the operation switch 15 is turned on and a low-level control signal S1 (ON signal) is input in the power supply controller 10 while initially the power supply voltage is higher than or equal to a constant voltage Vx, the voltage Vin generated by the internal power supply circuit 22 rises and the constant voltage Vx is generated. When the generated voltage Vin reaches the third level in this process, the FET 28 turns on. Then, when the voltage Vin reaches the first level, the output signal S4 from the hysteresis circuit 29 goes from high to low and the FET 28 turns off and a discharge preventing state is entered. When the generated voltage Vin increases to a level higher than or equal to the first level, the charging circuit 25 of the gate driving circuit 21 drives the power MOSFET 14 to turn on and into the power-on state in response to the drive signal S2 from the control logic unit 20.

After the power-on state is entered, the power supply potential Vcc can temporarily be dropped by start of the engine of the vehicle, for example. Especially when the amount of charge of the power source 12 is small, the power supply voltage Vcc' can temporarily be dropped by the start of the engine to a level lower than the first level. If the power supply voltage Vcc' drops to a level lower than or equal to the constant voltage Vx to be generated by the internal power supply circuit 22, the voltage Vcc' generated by the internal power supply circuit 22 drops to a level approximately equal to the power supply voltage Vcc'.

As shown in FIG. 2, after the power supply voltage Vcc' (generated voltage Vin) drops to a level between the first and second levels (period A in FIG. 2), the power supply voltage Vcc' (generated voltage Vin), the output signal S4 from the hysteresis circuit 29 is held low and the FET 28 is still in the off state and continues to prevent discharge by the time point at which the power supply voltage Vcc' (generated voltage Vin) decreases below the first level. That is, the charge on the gate accumulated by driving the charging circuit 25 is prevented from being discharged to hold the potential of the gate, thereby holding the power MOSFET 14 in the power-on state to continue power supply to the load 11. Since the voltage Vin generated by the internal power supply circuit 22 is still at a level higher than or equal to the second level that can drive the control logic unit 20, the control logic unit 20 can properly operate to drive the discharging circuit 26 to cause the power MOSFET 14 to perform normal turn off operation even if a high-level control signal (OFF signal) is input into the power supply controller 10.

On the other hand, when the power supply voltage Vcc' (generated voltage Vin) drops below the second level (periods B and C), the output signal S4 from the hysteresis circuit 29 goes from low to high and the FET 28 turns on, causing the first forced turn-off operation by the time point at which the power supply voltage Vcc' (generated voltage Vin) drops below the second level. The purpose of this is to avoid the problem that the control logic unit 20 cannot properly operate and the normal turn-off operation is not performed in response to a high-level control signal S1 being input in the power supply controller 10 once the power supply voltage Vcc' (generated voltage Vin) drops below the second level as described above. After the power supply voltage Vcc' (generated voltage Vin) subsequently exceeds the first level, the FET 28 is turned off and the charging circuit 25 causes the poser MOSFET to return to the power-on state.

In period C, the FET 28 is in the off state while the power supply voltage Vcc' (generated voltage Vin) is lower than the third level. However, before and after that duration(period C), the FET 28 is turned on to discharge the charge of the gate and therefore the power MOSFET can be turned off.

As has been described above, according to the illustrative aspect, even if the power supply voltage Vcc' (generated voltage Vin) drops below the first level after the low-level control signal S1 is input with the power supply voltage Vcc' (generated voltage Vin) higher than or equal to the first level and the power MOSFET 14 is properly turned on, the power MOSFET 14 can be held in the power-on state to continue to supply power to the load 11 as long as the power supply voltage Vcc' (generated voltage Vin) does not drop below the second level that can properly drive the control logic unit 20.

(3) Measure Against Ground Terminal Connection Failure

The semiconductor device 17 includes a turn-off circuit 50 that forces the power MOSFET 14 to turn off when the ground terminal P5 is not properly connected to an appropriate ground and the electric potential Vgnd of the ground terminal P5 is higher than the source potential Vs of the power MOSFET 14 by an amount equal to a fourth predetermined level (an example of a "predetermined level"). The forced turnoff (state) by the turn-off circuit 50 is referred to as the "second forced turn-off (state)".

The turn-off circuit 50 includes a short-circuit FET 51 which is a switching element connected between the gate and source of the power MOSET 14. The gate of the FET 51 is connected to the ground terminal P5 through resisters 52 and 24 so that a voltage dependent on the potential Vgnd at the ground terminal P5 is applied to the gate. A resistance 53 is connected across the gate-source of the FET 51.

The FET 51 turns on to short the gate and source of the power MOSFET 14 to place the power MOSFET 14 in the second forced turn-off state when the potential difference between the potential Vgnd at the ground terminal P5 and the source potential Vs of the power MOSFET 14 is higher than or equal to the fourth level.

Even while the ground terminal P5 is properly grounded and the power MOSFET 14 is in the normal turn-off state (in which it is receiving the high-level control signal S1), there can be a potential difference between the potential at the position where ground terminal P5 is grounded and the position where the load 11 is grounded if they are a long distance apart from each other, for example in the vehicle's sheet metal. That is, the potential Vgnd of the ground terminal P5 can be higher than the potential of the source Vs of the power MOSFET 14 (the ground potential of the load 11) by an amount equal to a certain level (fifth level). Furthermore, if the fourth level is set to a level higher than the threshold voltage of the power MOSFET 14 (the voltage between the gate and source at the time when the power MOSFET 14 is brought into conduction), the power MOSFET 14 is turned on when the ground terminal P5 is not properly grounded and the potential Vgnd of the ground terminal P5 becomes higher than the source potential Vs of the power MOSFET 14 (the ground potential of the load 11) by an amount equal to the threshold voltage.

To avoid the problem, the fourth level in the illustrative aspect is set to a value greater than the potential difference between the ground terminal P5 and the source of the power MOSFET 14 that appears when the ground terminal P5 is properly grounded and the power MOSFET 14 is in the normal turn-off state and smaller than the threshold voltage of the power MOSFET 14. This setting can prevent the power MOSFET 14 from being placed in the second forced turn-off state when the ground terminal P5 is properly grounded. This setting also can ensure that the power MOSFET 14 is placed into the second forced turn-off state while preventing the power MOSFET 14 from being turned on without the ground terminal P5 being grounded.

[Other Aspects]

The present invention is not limited to the aspect described above and shown in the drawings.

(1) The FET 51 provided between the gate and source of the power MOSFET 14 is turned on to short the gate and source of the power MOSFET 14 to place the power MOSFET 14 in the second turn-off state in the illustrative aspect described above. However, the gate and source of the power MOSFET 14 do not necessarily be shorted. Any configuration that controls the gate potential so that the voltage across the gate-source of the power MOSFET 14 does not exceed the threshold voltage.

Figure 3:
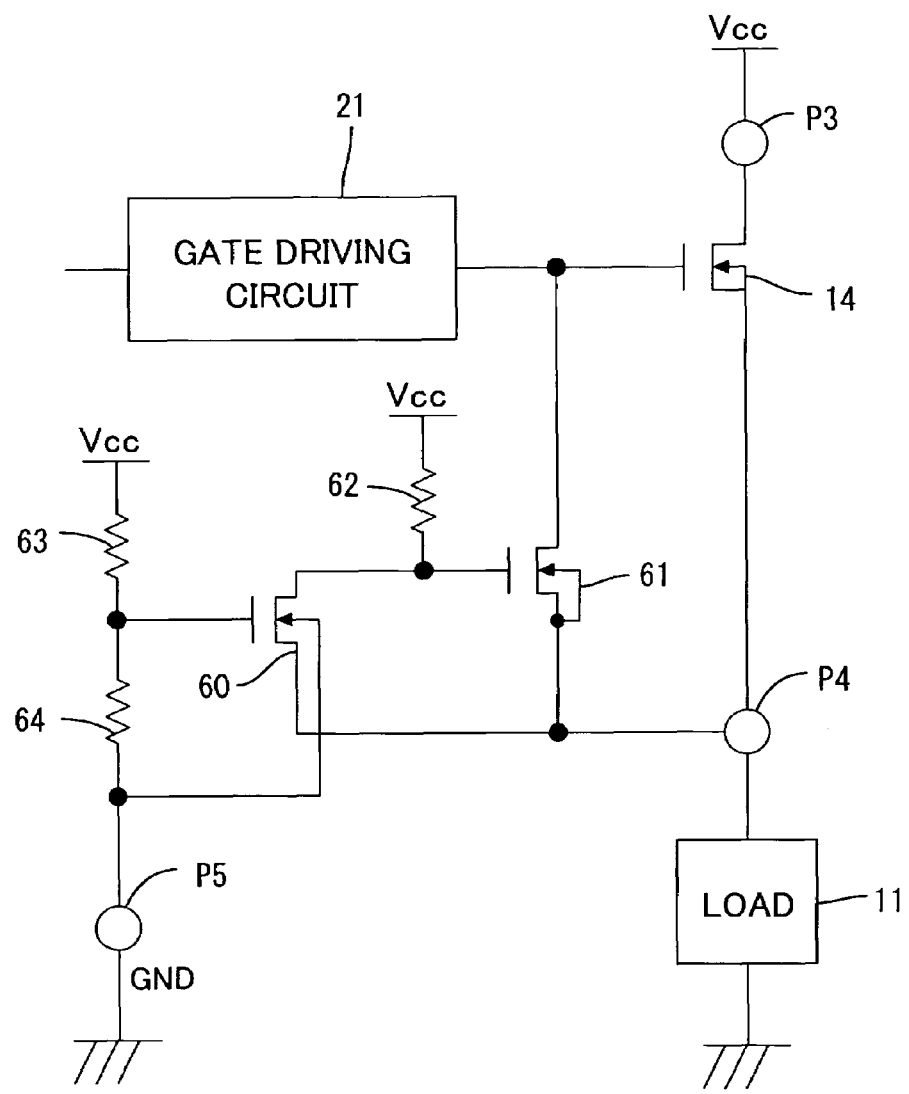
FIG. 3 is a block diagram showing a variation of the illustrative aspect.

(2) The potential Vs of the source of the power MOSFET 14 and the potential Vgnd of the ground terminal P5 are directly detected and, if the difference between them is greater than or equal to the fourth level, the power MOSFET 14 is placed into the second turn-off state in the illustrative aspect described above. However, the present invention is not so limited. The potential difference between the positive power source and the ground terminal may be detected and, if the potential difference is smaller than a predetermined value, the power MOSFET 14 may be placed in the second forced turn-off state. In this way, the second forced turn-off state can be provided when the potential of the ground terminal is higher than the potential of the source of the power MOSFET 14 by an amount equal to the fourth level. In particular, a resistance 62 and a FET 60 which is a switching element are provided between the power source 12 and the ground terminal P5 as shown in FIG. 3, and a partial voltage obtained through use of resistances 63 and 64 connected between the power source 12 and the ground terminal PS is applied to the gate of the FET 60. A FET 61 which is a switching element is connected between the gate and source of the power MOSFET 14. The drain of the FET 60 is connected to the gate of the FET 61. With this configuration, when the potential Vgnd of the ground terminal P5 increases and the power supply voltage Vcc' decreases below a predetermined value (power supply potential Vcc, which is the fourth level), the FET 60 turns off and the FET 61 turns on to place the power MOSFET 14 into the second forced-turn off state.

What is claimed is:

1. A power supply controller comprising:
   an n-channel MOSFET provided between a power source and a load;
   a ground terminal;
   a gate driving circuit structured to control a gate terminal potential to turn on the MOSFET, and to control the gate terminal potential to turn off power to turn off the MOSFET, based on a ground terminal potential; and
   a turn-off circuit structured to switch the MOSFET into a turn-off state regardless of control by the gate driving circuit when the ground terminal potential is at a higher value than a source potential of the MOSFET.

2. The power supply controller according to claim 1, wherein the higher value is set to a value greater than the potential difference between the ground terminal and a source terminal of the MOSFET when the ground terminal is properly grounded and the MOSFET is turned off by the gate driving circuit.

3. The power supply controller according to claim 1, wherein the higher value is set to a value smaller than a threshold voltage of the MOSFET.

4. The power supply controller according to claim 2, wherein the higher value is set to a value smaller than a threshold voltage of the MOSFET.

5. The power supply controller according to claim 1, wherein the turn-off circuit has a switching element connected between a gate terminal and a source terminal of the MOSFET, and turns on the switching element to reduce the voltage between the gate terminal and the source terminal to a value below a threshold voltage of the MOSFET when the ground terminal potential is at the higher value than the source potential of the MOSFET.

6. The power supply controller according to claim 2, wherein the turn-off circuit has a switching element connected between a gate terminal and the source terminal of the MOSFET, wherein the turn-off circuit turns on the switching element to reduce the voltage between the gate terminal and the source terminal to a value below a threshold voltage of the MOSFET when the ground terminal potential is at the higher value than the source potential of the MOSFET.

7. The power supply controller according to claim 3, wherein the turn-off circuit has a switching element connected between a gate terminal and a source terminal of the MOSFET, wherein the turn-off circuit turns on the switching element to reduce the voltage between the gate terminal and the source terminal to a value below the threshold voltage of the MOSFET when the ground terminal potential is at the higher value than the source potential of the MOSFET.

8. The power supply controller according to claim 4, wherein the turn-off circuit has a switching element connected between a gate terminal and the source terminal of the MOSFET, wherein the turn-off circuit turns on the switching element to reduce the voltage between the gate terminal and the source terminal to a value below the threshold voltage of the MOSFET when the ground terminal potential is at the higher value than the source potential of the MOSFET.

9. A power supply controller comprising:
   an MOSFET provided between a power source and a load, wherein the MOSFET includes a gate terminal and a source terminal;
   a ground terminal;
   a gate driving circuit structured to control a gate terminal potential to turn on the MOSFET, and to control the gate terminal potential to turn off the MOSFET, based on a ground terminal potential; and a turn-off circuit capable of overriding the gate driving circuit to switch the MOSFET into a turn-off state when the ground terminal potential meets a set value, further wherein the set value is at a higher value than a potential of the source terminal of the MOSFET.

10. The power supply controller according to claim 9, wherein the set value is greater than the potential difference between the ground terminal and the source terminal of the MOSFET when the ground terminal is properly grounded and the MOSFET is turned off by the gate driving circuit.

11. The power supply controller according to claim 9, wherein the set value is smaller than a threshold voltage of the MOSFET.

12. The power supply controller according to claim 9, wherein the turn-off circuit includes a switching element connected between the gate terminal and the source terminal of the MOSFET.

13. The power supply controller according to claim 12, wherein the turn-off circuit turns on the switching element to reduce the voltage between the gate terminal and the source terminal to a value below a threshold voltage of the MOSFET when the ground terminal potential is at the higher value than the source terminal potential of the MOSFET.

14. A power supply controller comprising:
an MOSFET provided between a power source and a load, wherein the MOSFET includes a gate terminal and a source terminal;
a ground terminal;
a gate driving circuit means for controlling a gate terminal potential to turn on the MOSFET. and for controlling the gate terminal potential to turn OFF the MOSFET. based on a ground terminal potential; and
a turn-off circuit means for overriding the gate driving circuit means to switch the MOSFET into a turn-off state when the ground terminal potential meets a set value, further wherein the set value is at a higher value than a potential of the source terminal of the MOSFET.

15. The power supply controller according to claim 14, wherein the set value is greater than the potential difference between the ground terminal and the source terminal of the MOSFET when the ground terminal is properly grounded and the MOSFET is turned off based on the gate driving circuit means.

16. The power supply controller according to claim 14, wherein the set value is smaller than a threshold voltage of the MOSFET.

17. The power supply controller according to claim 14, wherein the turn-off circuit means includes a switching element connected between the gate terminal and the source terminal of the MOSFET.

18. The power supply controller according to claim 17, wherein the turn-off circuit means turns on the switching element to reduce the voltage between the gate terminal and the source terminal to a value below a threshold voltage of the MOSFET when the ground terminal potential is at the higher value than the source terminal potential of the MOSFET.

* * * * *